US010734500B2

(12) United States Patent
Lin et al.

(10) Patent No.: US 10,734,500 B2
(45) Date of Patent: Aug. 4, 2020

(54) HORIZONTAL GATE ALL-AROUND DEVICE HAVING WRAPPED-AROUND SOURCE AND DRAIN

(71) Applicant: Taiwan Semiconductor Manufacturing Company, Ltd., Hsin-Chu (TW)

(72) Inventors: Chun-Hsiung Lin, Hsin-Chu (TW); Chung-Cheng Wu, Hsin-Chu County (TW); Carlos H. Diaz, Mountain View, CA (US); Chih-Hao Wang, Hsinchu County (TW); Wen-Hsing Hsieh, Hsin-Chu (TW); Yi-Ming Sheu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/155,387

(22) Filed: Oct. 9, 2018

(65) Prior Publication Data
US 2019/0051734 A1    Feb. 14, 2019

Related U.S. Application Data

(60) Continuation of application No. 15/670,701, filed on Aug. 7, 2017, now Pat. No. 10,109,721, which is a
(Continued)

(51) Int. Cl.
*H01L 29/417*   (2006.01)
*H01L 29/66*    (2006.01)
(Continued)

(52) U.S. Cl.
CPC .............. *H01L 29/66545* (2013.01); *H01L 21/823431* (2013.01); *H01L 27/0886* (2013.01);
(Continued)

(58) Field of Classification Search
CPC ..... H01L 21/823431; H01L 21/823821; H01L 27/0886; H01L 27/0924; H01L 27/1211;
(Continued)

(56) References Cited

U.S. PATENT DOCUMENTS 7,452,778 B2    11/2008 Chen et al.
8,487,378 B2    7/2013 Goto et al.
(Continued)

FOREIGN PATENT DOCUMENTS

| CN | 104011849 A | 8/2014 |
|---|---|---|
| CN | 104584227 A | 4/2015 |
| CN | 104701376 A | 6/2015 |
| WO | 2015047354 A1 | 4/2015 |

*Primary Examiner* — Stephen W Smoot
(74) *Attorney, Agent, or Firm* — Haynes and Boone, LLP

(57) ABSTRACT

Various transistors, such as horizontal gate-all-around transistors, and methods of fabricating such are disclosed herein. An exemplary transistor includes a first nanowire and a second nanowire that include a first semiconductor material, a gate that wraps a channel region of the first nanowire and the second nanowire, and source/drain feature that wraps source/drain regions of the first nanowire and the second nanowire. The source/drain feature includes a second semiconductor material that is configured differently than the first semiconductor material. In some implementations, the transistor further includes a fin-like semiconductor layer disposed over a substrate. The first nanowire and the second nanowire are disposed over the fin-like semiconductor layer, such that the first nanowire, the second nanowire, and the fin-like semiconductor layer extend substantially parallel to one another along the same length-wise direction. The fin-like semiconductor layer includes a third semiconductor material that is configured differently than the first semiconductor material.

20 Claims, 15 Drawing Sheets

Related U.S. Application Data division of application No. 14/942,696, filed on Nov. 16, 2015, now Pat. No. 9,754,840.

(51) Int. Cl.
*H01L 21/8234* (2006.01)
*H01L 27/088* (2006.01)
*H01L 29/423* (2006.01)
*H01L 29/78* (2006.01)

(52) U.S. Cl.
CPC .. *H01L 29/41791* (2013.01); *H01L 29/42392* (2013.01); *H01L 29/66795* (2013.01); *H01L 29/785* (2013.01); *H01L 2029/7858* (2013.01)

(58) Field of Classification Search
CPC ......... H01L 29/41791; H01L 29/66795; H01L 29/6681; H01L 29/66818; H01L 29/785; H01L 2029/7858

See application file for complete search history.

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 9,035,277 B2 | 5/2015 | Ching et al. |
| 9,484,405 B1 | 11/2016 | Balakrishnan et al. |
| 2008/0135949 A1 | 6/2008 | Lo et al. |
| 2012/0138886 A1 | 6/2012 | Kuhn et al. |
| 2013/0270512 A1 | 10/2013 | Radosavljevic et al. |
| 2013/0307513 A1 | 11/2013 | Then et al. |
| 2014/0084370 A1 | 3/2014 | Cappellani et al. |
| 2014/0209855 A1* | 7/2014 | Cea ............... H01L 29/41791 257/9 |
| 2014/0282326 A1 | 9/2014 | Hsin et al. |
| 2015/0060997 A1 | 3/2015 | Basu et al. |
| 2015/0236120 A1 | 8/2015 | Hashemi et al. |
| 2016/0276484 A1 | 9/2016 | Kim et al. |
| 2017/0005195 A1 | 1/2017 | Ching et al. |

\* cited by examiner

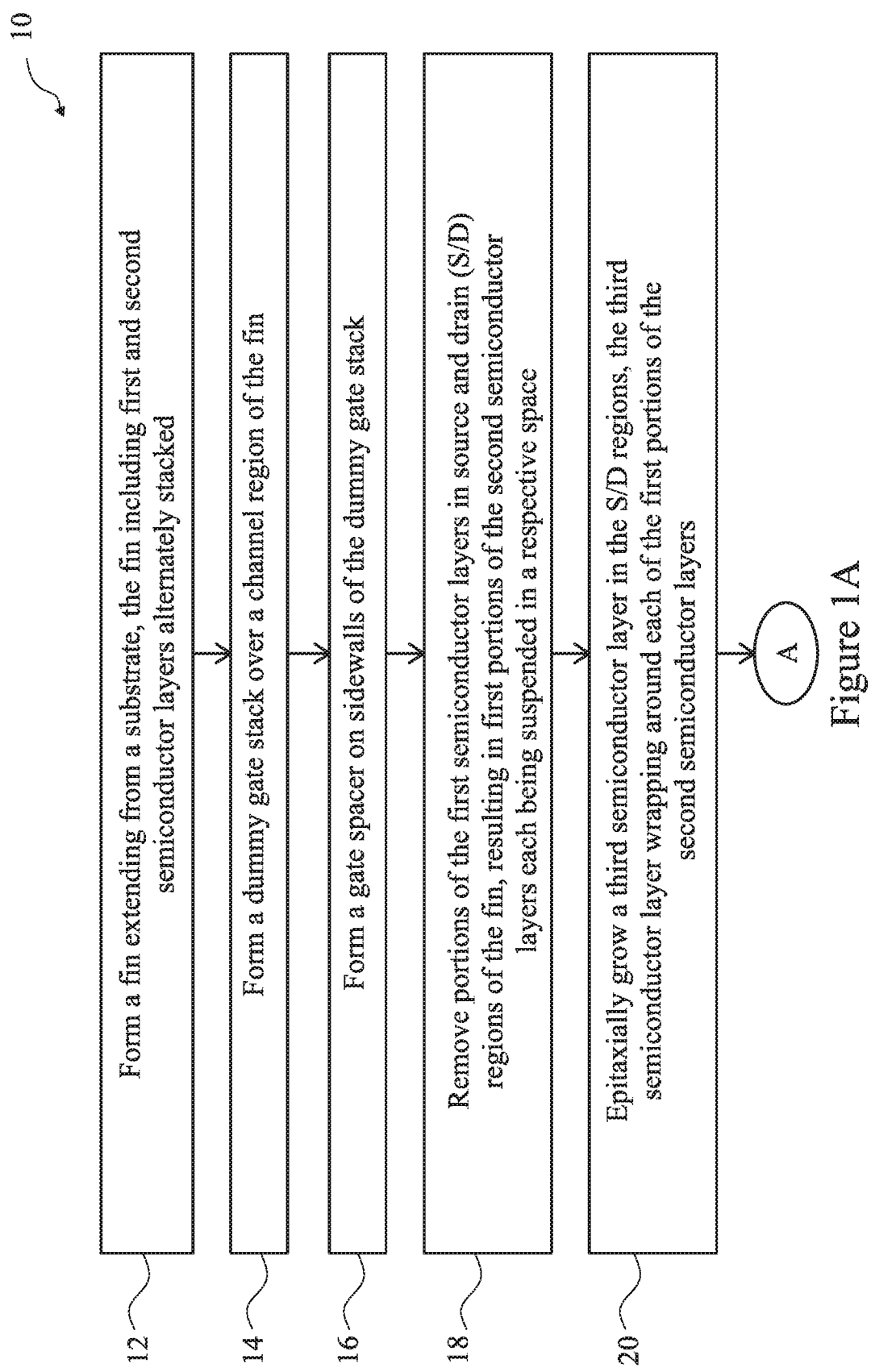

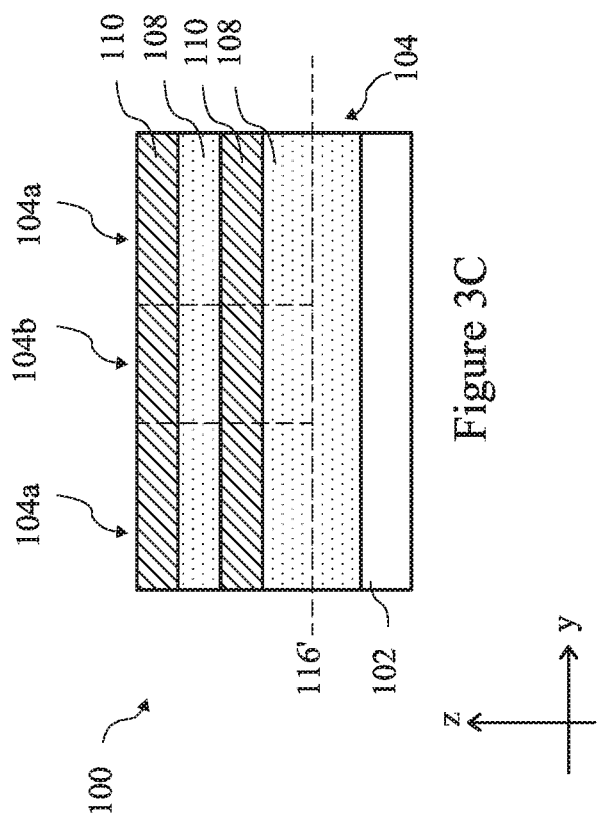
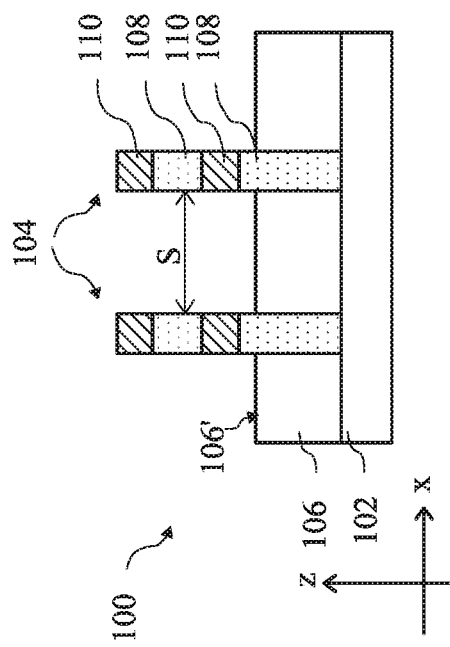
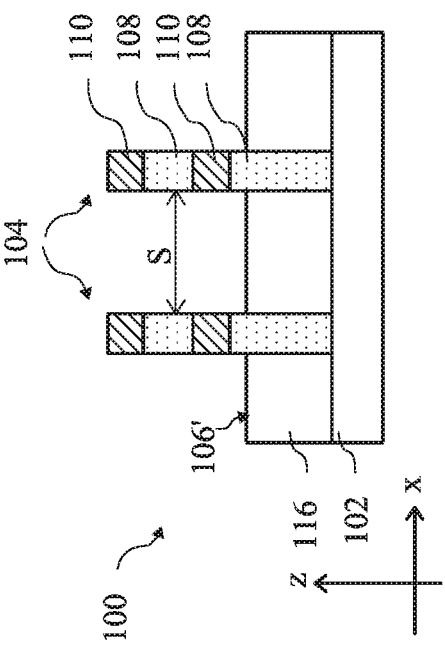

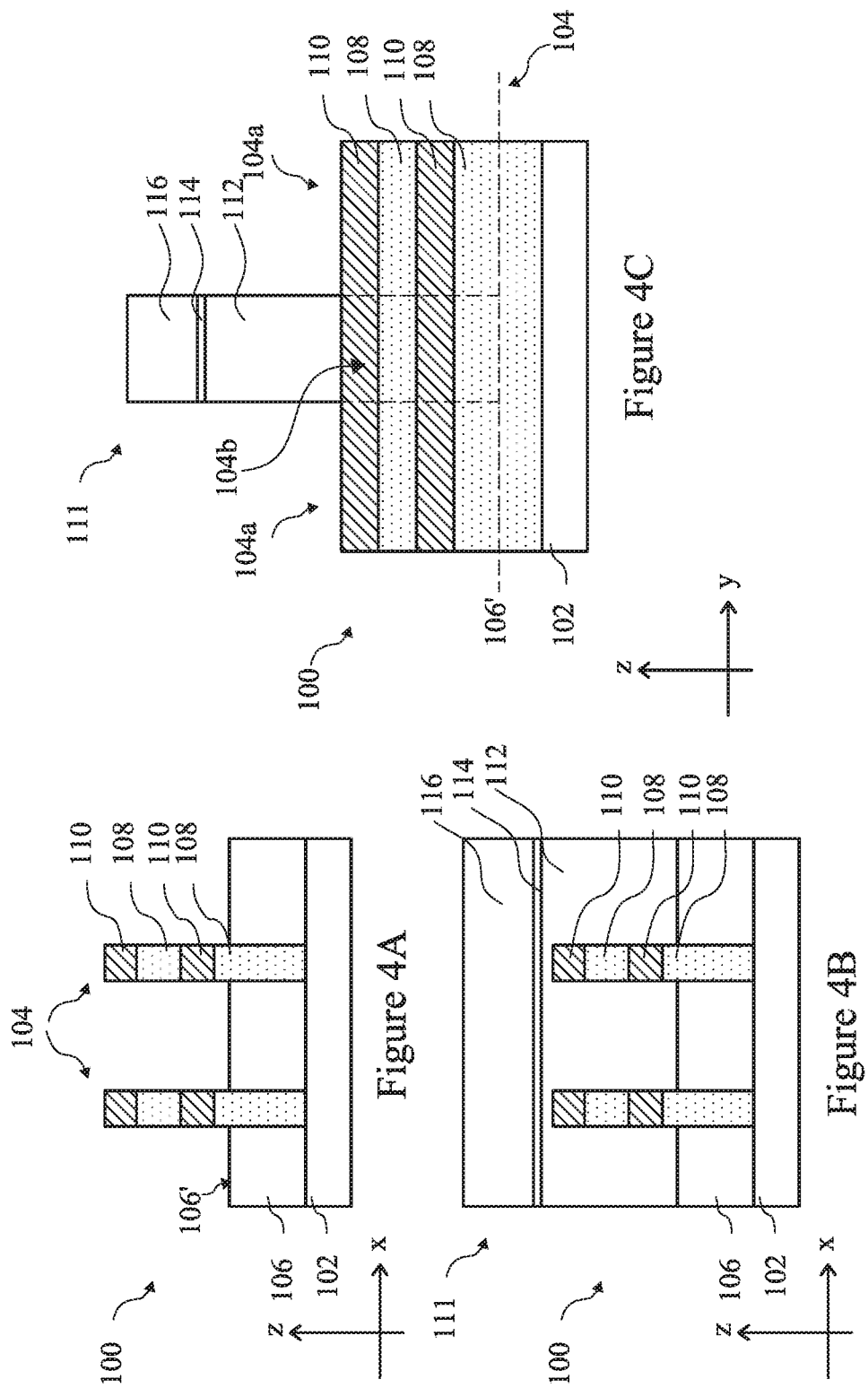

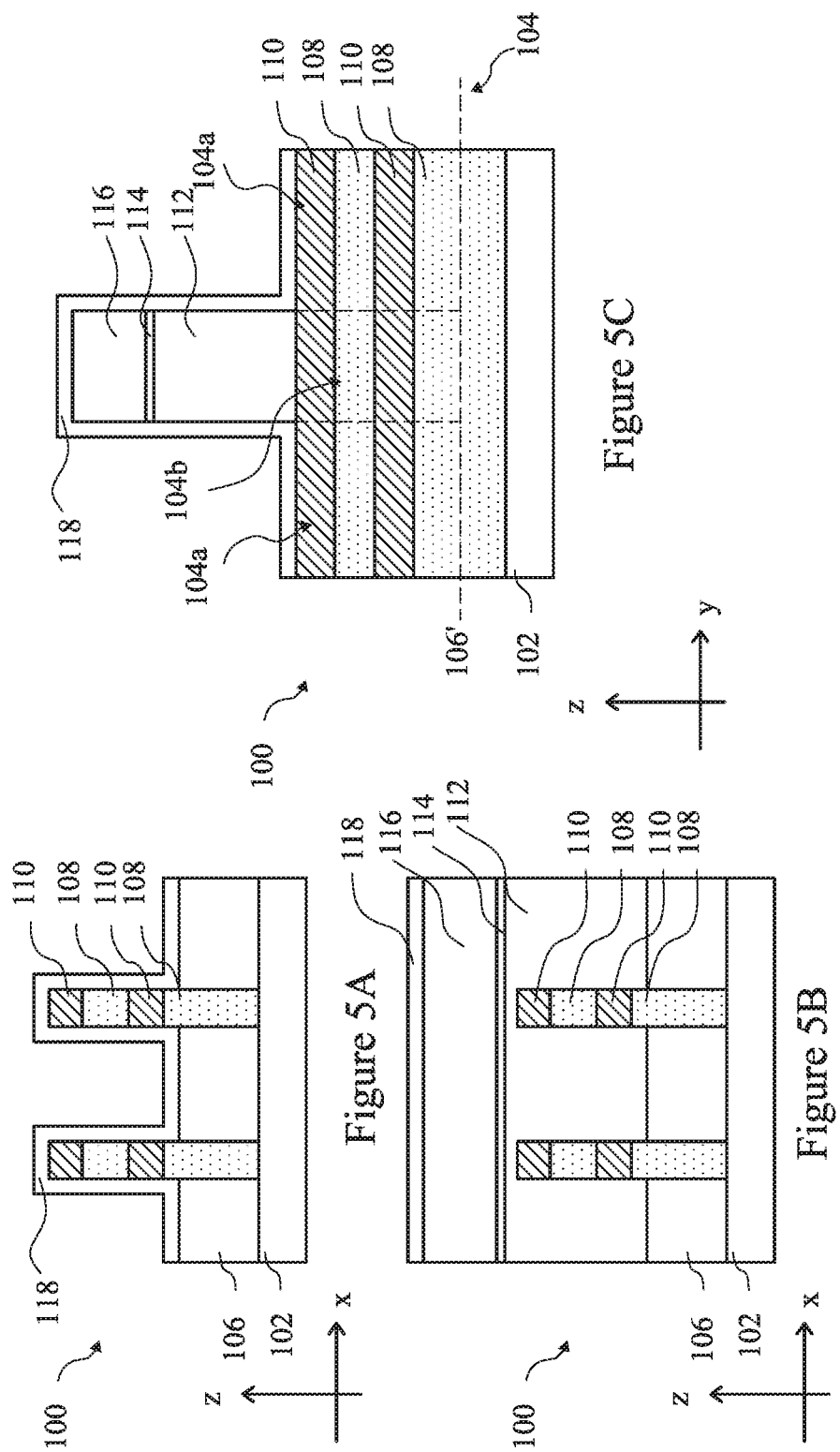

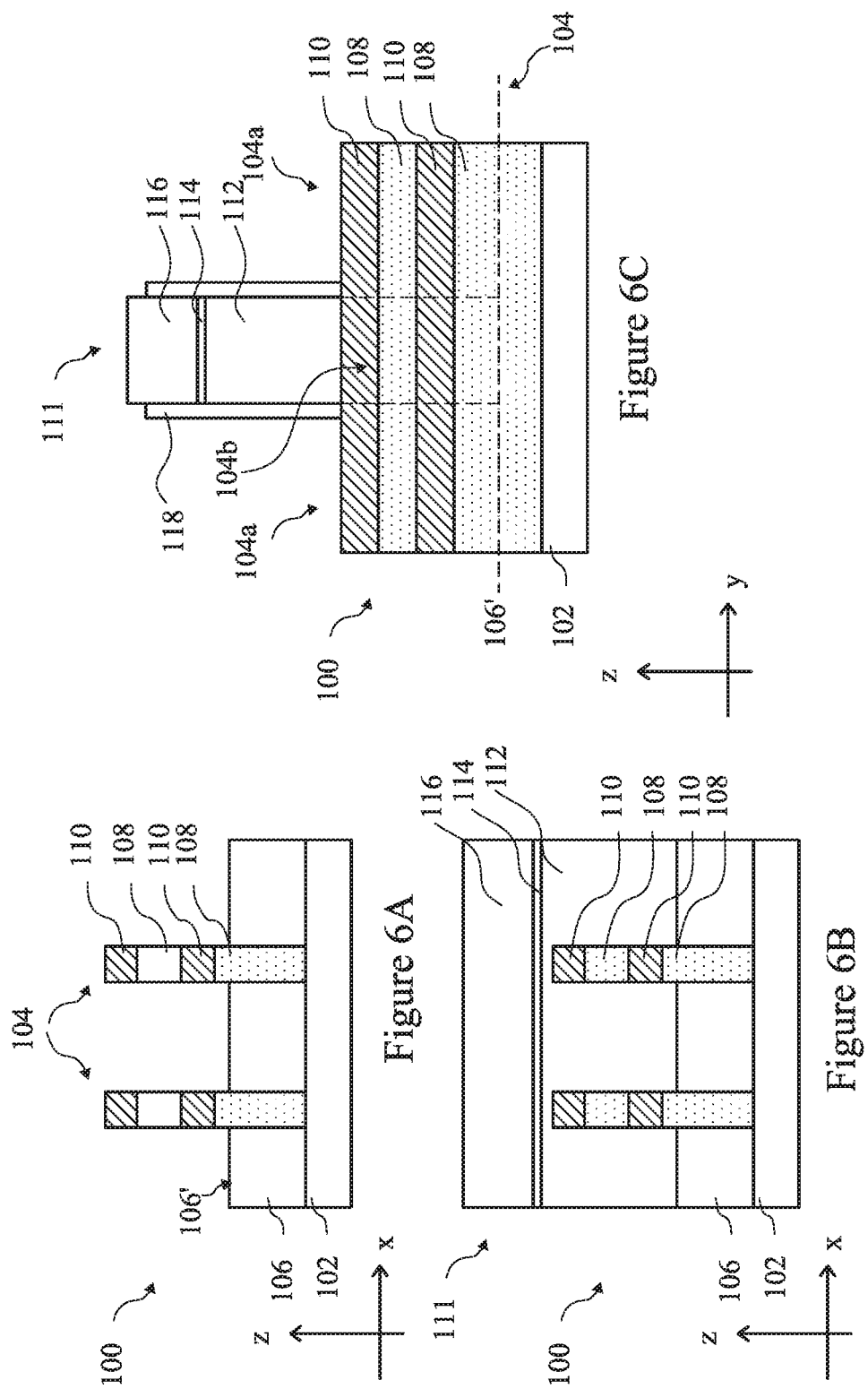

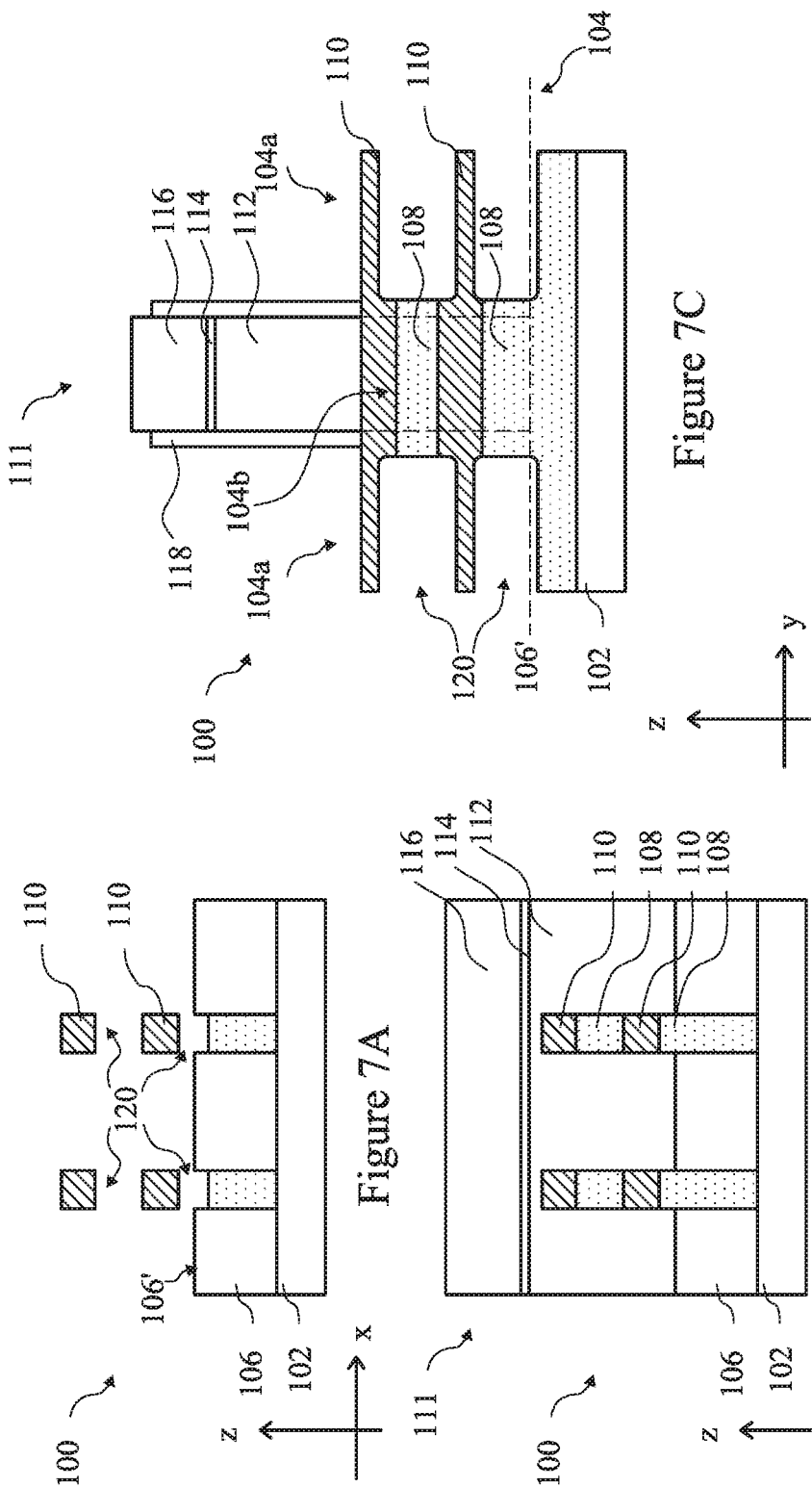

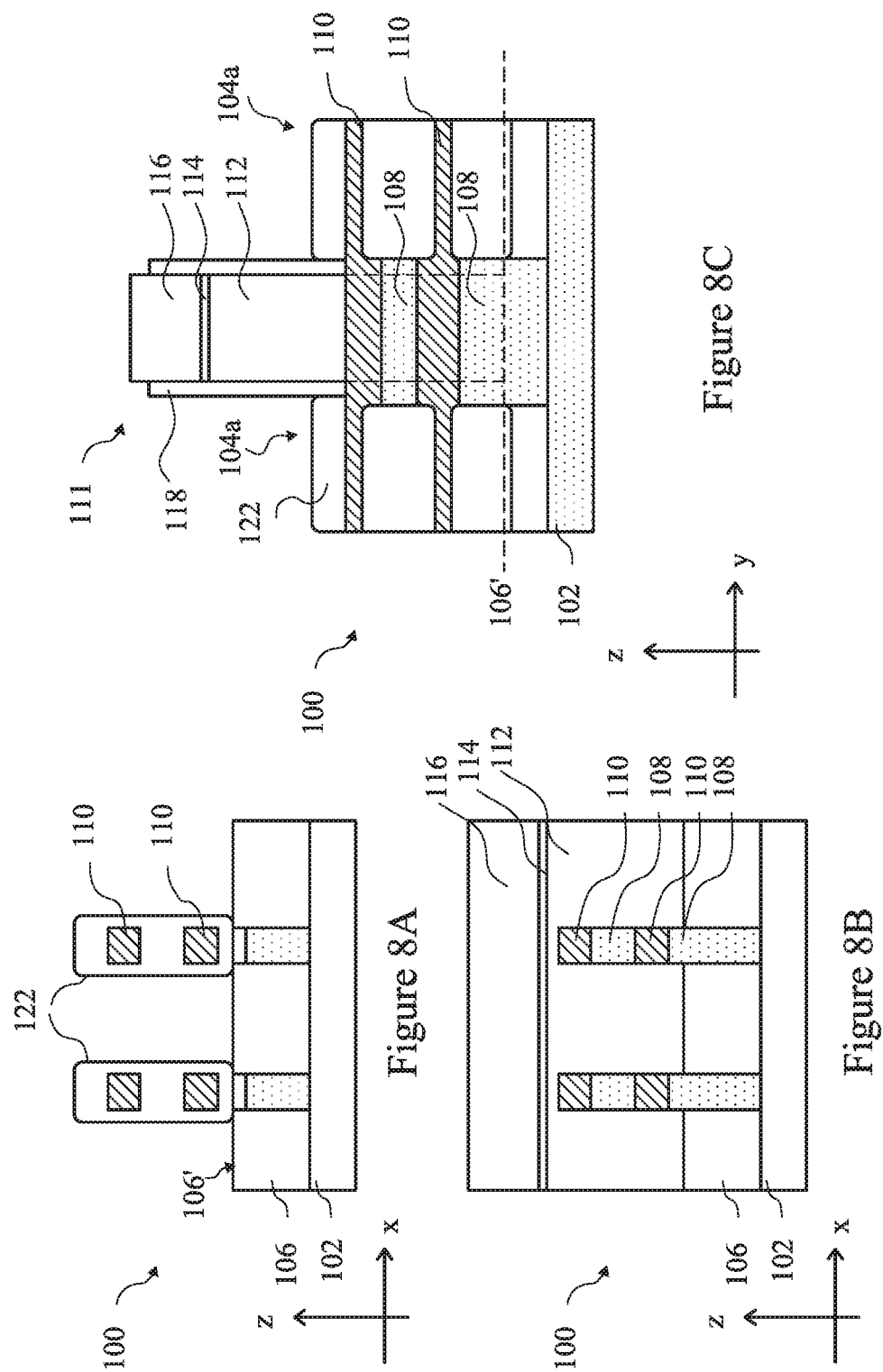

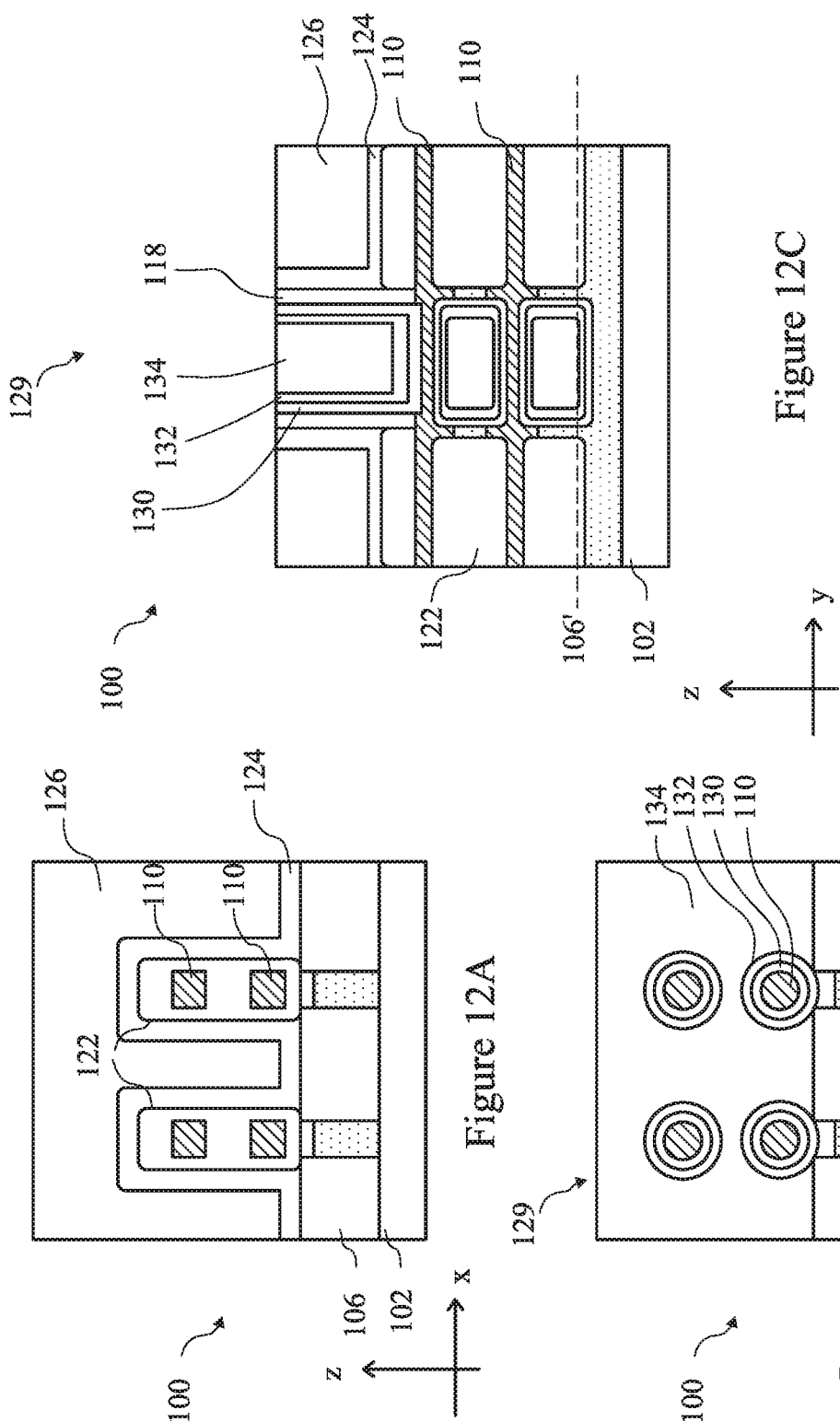

HORIZONTAL GATE ALL-AROUND DEVICE HAVING WRAPPED-AROUND SOURCE AND DRAIN

This application is a continuation application of U.S. patent application Ser. No. 15/670,701, filed Aug. 7, 2017, now U.S. Pat. No. 10,109,721, which is a divisional application of U.S. patent application Ser. No. 14/942,696, filed Nov. 16, 2015, now U.S. Pat. No. 9,754,840, the entire disclosures of which are incorporated herein by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides. The HGAA transistors are compatible with conventional complementary metal-oxide-semiconductor (CMOS) processes, allowing them to be aggressively scaled down while maintaining gate control and mitigating SCEs. However, fabrication of the HGAA transistors can be challenging. For example, source and drain (S/D) formation for HGAA transistors by the current methods is not satisfactory in all respects, especially when the device pitch is small, such as 40 nanometers (nm) or smaller.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A and 1B are a flow chart of a method of forming a semiconductor device according to various aspects of the present disclosure.

FIGS. 3A, 4A, 5A, 6A, 7A, 8A, 9A, 10A, 11A, and 12A are cross-sectional views of a portion of the semiconductor device in FIG. 2, along the "A-A" line of FIG. 2, in accordance with some embodiments.

FIGS. 3B, 4B, 5B, 6B, 7B, 8B, 9B, 10B, 11B, and 12B are cross-sectional views of a portion of the semiconductor device in FIG. 2, along the "B-B" line of FIG. 2, in accordance with some embodiments.

FIGS. 3C, 4C, 5C, 6C, 7C, 8C, 9C, 10C, 11C, and 12C are cross-sectional views of a portion of the semiconductor device in FIG. 2, along the "C-C" line of FIG. 2, in accordance with some embodiments.

DETAILED DESCRIPTION

Figure 1B:
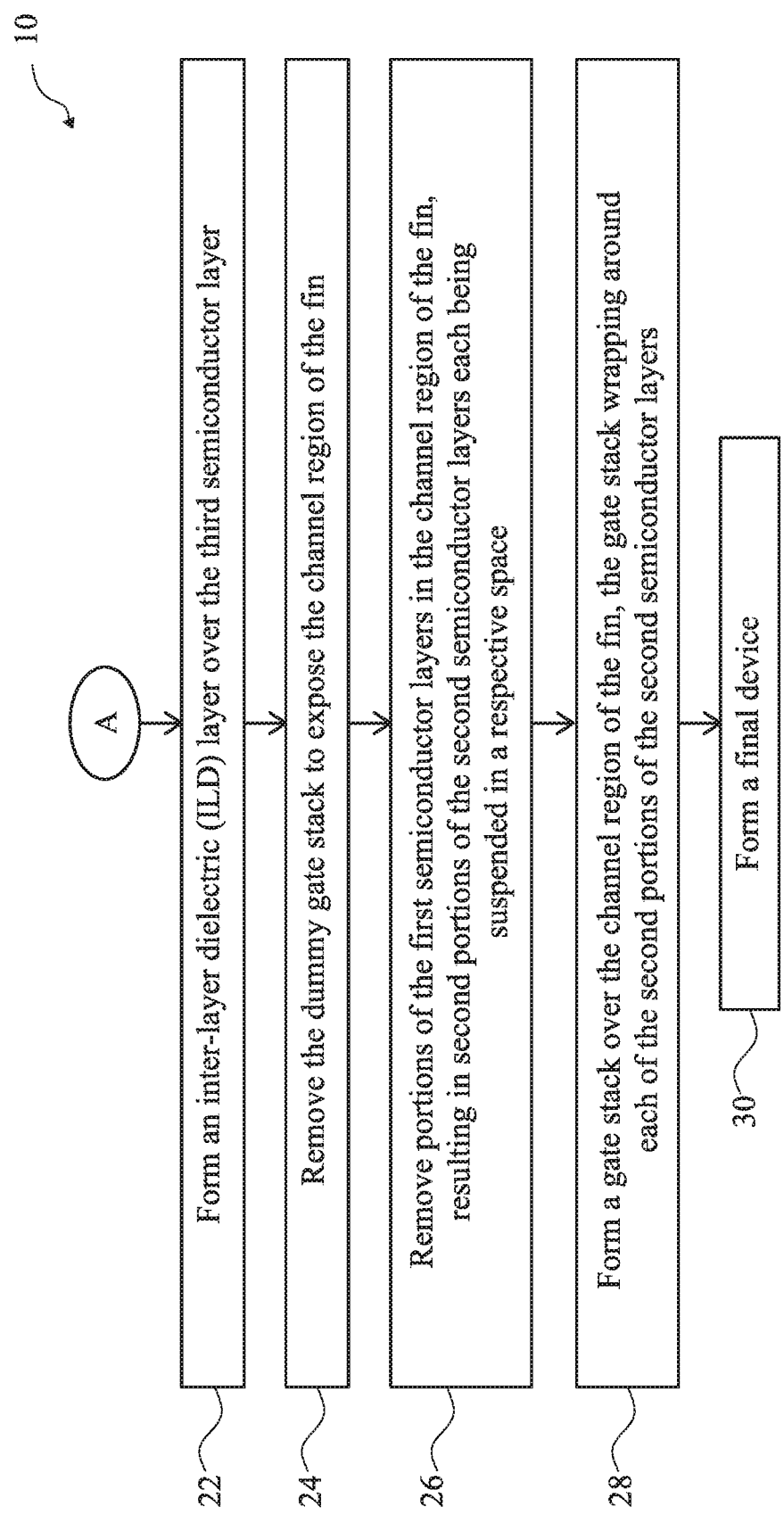

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to gate-all-around (GAA) devices. A GAA device includes any device that has its gate structure, or portions thereof, formed on four-sides of a channel region (e.g., surrounding a portion of a channel region). The channel region of a GAA device may include nanowire channels, bar-shaped channels, and/or other suitable channel configurations. In embodiments, the channel region of a GAA device may have multiple horizontal nanowires or horizontal bars vertically spaced, making the GAA device a stacked horizontal GAA (S-HGAA) device. The GAA devices presented herein may include p-type metal-oxide-semiconductor GAA devices or n-type metal-oxide-semiconductor GAA devices. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

Figure 2:
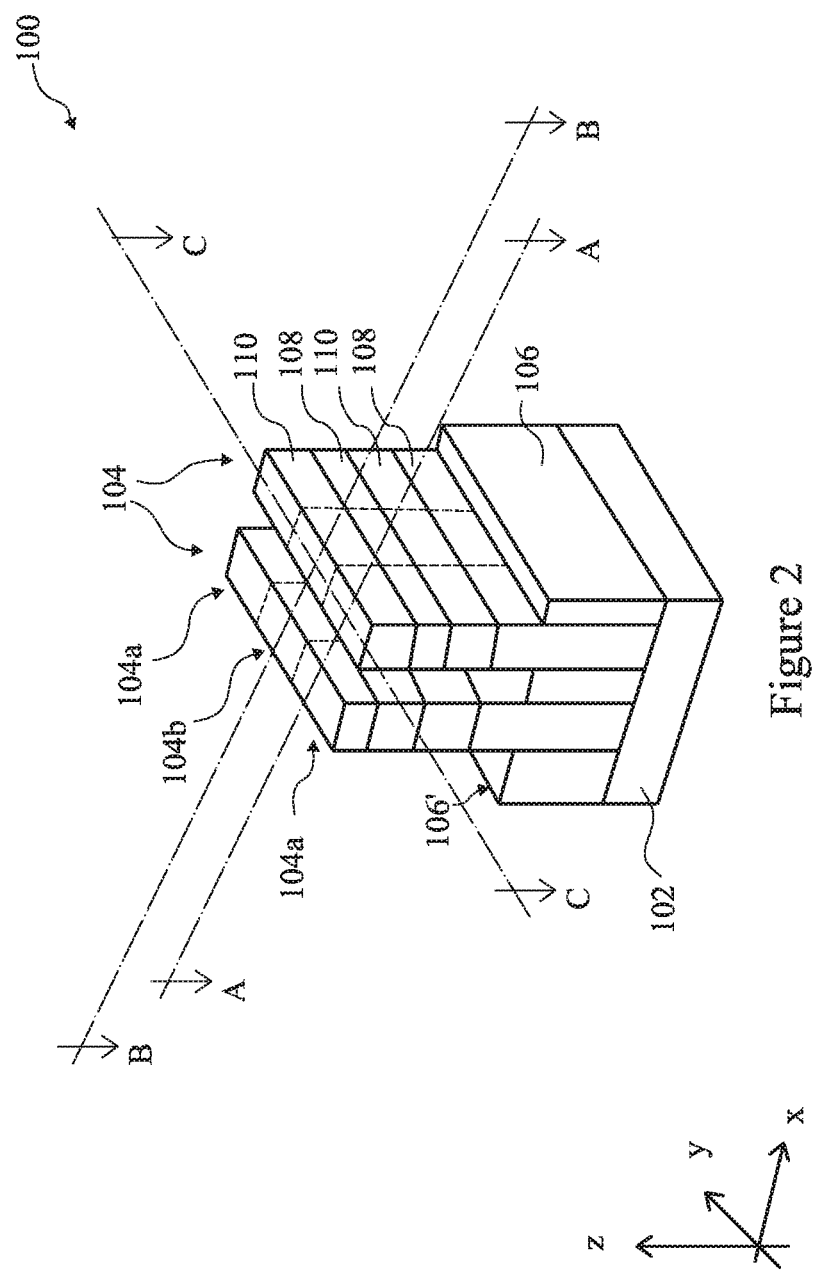
FIG. 2 is a perspective view of a portion of a semiconductor device in an intermediate stage of fabrication according to an embodiment of the method in FIGS. 1A and 1B.

FIGS. 1A and 1B show a flow chart of a method 10 of forming a semiconductor device 100, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-12C. FIG. 2 is a perspective view of a portion of the semiconductor device 100 in an intermediate stage of fabrication. FIGS. 3A-12A, 3B-12B, and 3C-12C are cross-sectional views of the semiconductor device 100 in various stages of a manufacturing process, taken along the "A-A," "B-B," and "C-C" lines of FIG. 2 respectively.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2-12C may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

At operation 12, the method 10 (FIG. 1A) forms one or more fins 104 extending from a substrate 102 and each fin 104 includes a stack of semiconductor layers 108 and 110. Referring to FIG. 2, in the present embodiment, the device 100 includes two fins 104, and each fin 104 includes two semiconductor layers 108 and two semiconductor layers 110. The two fins 104 are oriented lengthwise along the "y" direction and are arranged side by side along the "x" direction. The lower portions of the fins 104 are separated by an isolation structure 106. The semiconductor layers 108 and 110 are vertically stacked (along the "z" direction) in an alternating fashion (e.g., a first layer 110 disposed over a first layer 108, a second layer 108 disposed over the first layer 110, and a second layer 110 disposed over the second layer 108, and so on). In various embodiments, the device 100 may include any number of fins 104 and the fins 104 may include any number of alternately stacked semiconductor layers 108 and 110.

Still referring to FIG. 2, the fins 104 each include two source/drain (S/D) regions 104a and a channel region 104b between the two S/D regions 104a. The "A-A" line is taken across one of the S/D regions 104a, the "B-B" line is taken across the channel region 104b, and the "C-C" line is taken lengthwise across one of the fins 104. The following discussion is made with reference to FIGS. 2, 3A, 3B, and 3C collectively.

In embodiments, the substrate 102 may be a semiconductor substrate such as a silicon substrate. The substrate 102 may include various layers, including conductive or insulating layers formed on a semiconductor substrate. The substrate 102 may include various doping configurations. For example, different doping profiles (e.g., n wells, p wells) may be formed on the substrate 102 in regions designed for different device types (e.g., n-type field effect transistors (NFET), p-type field effect transistors (PFET)). The substrate 102 may also include other semiconductors such as germanium, silicon carbide (SiC), silicon germanium (SiGe), or diamond. Alternatively, the substrate 102 may include a compound semiconductor and/or an alloy semiconductor. Further, the substrate 102 may optionally include an epitaxial layer, may be strained for performance enhancement, may include a silicon-on-insulator structure, and/or have other suitable enhancement features.

The two fins 104 are spaced (along the "x" direction) by a spacing S (FIGS. 3A and 3B). In an embodiment, the spacing S is designed to be less than 50 nm, such as in a range from about 10 nm to about 30 nm, for tight device integration. The isolation structures 106 may be formed of silicon oxide, silicon nitride, silicon oxynitride, fluoride-doped silicate glass, a low-k dielectric material, and/or other suitable insulating material. The isolation structures 106 may be shallow trench isolation (STI) features.

The semiconductor layers 108 and 110 may have different thicknesses. The semiconductor layers 108 may have different thicknesses from one layer to another layer. The semiconductor layers 110 may have different thicknesses from one layer to another layer. The thickness of each of the semiconductor layers 108 and 110 may range from few nanometers to few tens of nanometers. The first layer of 108 (which is partially buried in the isolation structure 106) may be much thicker than other semiconductor layers 108 and 110. In an embodiment, each semiconductor layer 108 that extends above the isolation structure 106 has a thickness ranging from about 5 nm to about 20 nm, and each semiconductor layer 110 has a thickness ranging from about 5 nm to about 20 nm.

The two semiconductor layers 108 and 110 have different compositions. In various embodiments, the two semiconductor layers 108 and 110 provide for different oxidation rates and/or different etch selectivity. In an embodiment, the semiconductor layers 108 include silicon germanium (SiGe), and the semiconductor layers 110 include silicon (Si). To further this embodiment, the Si layer 110 may be undoped or substantially dopant-free (i.e., having an extrinsic dopant concentration from about 0 cm$^{-3}$ to about $1\times10^{17}$ cm$^{-3}$), where for example, no intentional doping is performed when forming the Si layer 110. Alternatively, the Si layer 110 may be intentionally doped. For example, the Si layer 110 may be doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. Furthermore, the SiGe layer 108 may include more than 25% Ge in molar ratio. For example, Ge may comprise about 25% to 50% of the SiGe layer 108 in molar ratio. Furthermore, the semiconductor layers 108 may include different compositions among them, and the semiconductor layers 110 may include different compositions among them.

In various embodiments, either of the semiconductor layers 108 and 110 may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 108 and 110 may be chosen based on providing differing oxidation rates and/or etch selectivity. The semiconductor layers 108 and 110 may be doped or undoped, as discussed above.

The operation 12 may include a variety of processes such as deposition, epitaxy, photolithography, and etching. Further, the operation 12 may form the isolation structure 106 and the fins 104 in different orders. In an embodiment, the operation 12 forms the isolation structure 106 before it forms the fins 104 (an isolation-first scheme). In another embodiment, the operation 12 forms the fins 104 before it forms the isolation structure 106 (a fin-first scheme). These two embodiments are further discussed below by way of examples.

In an isolation-first scheme, first, the operation 12 forms a masking element over the substrate 102 through a photolithography process. The photolithography process may include forming a photoresist (or resist) over the substrate 102, exposing the resist to a pattern that defines various geometrical shapes, performing post-exposure bake processes, and developing the resist to form the masking element.

Subsequently, the operation 12 etches the substrate 102 through the masking element to form first trenches therein. The etching processes may include one or more dry etching processes, wet etching processes, and other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The one or more etching processes form the first trenches in the substrate 102.

Subsequently, the operation 12 fills the first trenches with a dielectric material, such as silicon oxide, and performs a chemical mechanical planarization (CMP) process to planarize top surfaces of the dielectric material and the substrate 102. The dielectric material may be formed by chemical vapor deposition (CVD), plasma enhanced CVD (PECVD), physical vapor deposition (PVD), thermal oxidation, or other techniques. This layer of dielectric material is referred to as the dielectric layer 106, which isolates various portions of the substrate 102.

Next, the operation 12 etches the substrate 102 while the dielectric layer 106 remains substantially unchanged through a selective etching process, thereby forming second trenches between various portions of the dielectric layer 106. The second trenches are etched to a desired depth for growing the fins 104 therein. The etching process may be a dry etching process, a wet etching process, or another suitable etching technique.

Subsequently, the operation 12 epitaxially grows the semiconductor layers 108 and 110 in the second trenches. For example, each of the semiconductor layers 108 and 110 may be grown by a molecular beam epitaxy (MBE) process, a chemical vapor deposition (CVD) process such as a metal organic CVD (MOCVD) process, and/or other suitable epitaxial growth processes. In some embodiments, the epitaxially grown layers, such as the layers 108, include the same material as the substrate 102. In some embodiments, the epitaxially grown layers 108 and 110 include a different material than the substrate 102. Further embodiments of the materials of the layers 108 and 110 have been discussed above. A chemical mechanical planarization (CMP) process may be performed to planarize a top surface of the device 100.

Subsequently, the operation 12 recesses the dielectric layer 106 to provide the fins 104 extending above a top surface 106' of the dielectric layer 106, as shown in FIGS. 2 and 3A-3C. In some embodiments, a recessing depth is controlled (e.g., by controlling an etching time) so as to obtain a desired height of the exposed upper portion of the fins 104. The remaining portions of the dielectric layer 106 become the isolation structure 106.

In a fin-first scheme, the operation 12 may include substantially the same or similar processes as discussed above, albeit in different orders. Hence, it is briefly described. First, the operation 12 epitaxially grows semiconductor layers over the substrate 102. Then, the operation 12 forms a masking element over the semiconductor layers through a photolithography process. Subsequently, the operation 12 etches the semiconductor layers through the masking element to form trenches therein. The remaining portions of the semiconductor layers become the fins 104 that include the semiconductor layers 108 and 110. Subsequently, the operation 12 deposits a dielectric material, such as silicon oxide, into the trenches. A chemical mechanical planarization (CMP) process may be performed to planarize a top surface of the device 100. Thereafter, the dielectric material is recessed to form the isolation structure 106.

At operation 14, the method 10 (FIG. 1A) forms a gate stack 111 over the fins 104 and the isolation structure 106. In the present embodiment, the gate stack 111 will be removed in a later gate-replacement process. Hence, it is referred to as the dummy gate stack 111. Referring to FIGS. 4A-4C, the dummy gate stack 111 engages the fins 104 at the channel region 104b. The dummy gate stack 111 may include single or multiple layers of materials. In the present embodiment, the dummy gate stack 111 includes a polysilicon (or poly) layer 112, a dielectric etch stop (or CMP stop) layer 114, and a dielectric hard mask layer 116. In an embodiment, the dummy gate stack 111 further includes an interfacial layer (e.g., silicon oxide) underneath the poly layer 112. The etch stop layer 114 may include silicon oxide, silicon nitride, silicon oxynitride, or other dielectric materials. The hard mask layer 116 may include one or more layers of material such as silicon oxide and/or silicon nitride. The poly layer 112 may be formed by suitable deposition processes such as low-pressure chemical vapor deposition (LPCVD) and PECVD. The etch stop layer 114 and the hard mask layer 116 each may be formed by chemical oxidation, thermal oxidation, atomic layer deposition (ALD), CVD, and/or other suitable methods. In an embodiment, the various layers of the dummy gate stack 111 are first deposited as blanket layers, and then patterned with one or more photolithography and etching processes to form the dummy gate stack 111.

At operation 16, the method 10 (FIG. 1A) forms a gate spacer 118 on sidewalls of the dummy gate stack 111. In an embodiment, the operation 16 includes a deposition process and an etching process, which are illustrated in FIGS. 5A-5C and FIGS. 6A-6C respectively. Referring to FIGS. 5A-5C, a spacer layer 118 is deposited over the device 100, covering the various features thereon. The spacer layer 118 may include one or more dielectric materials such as silicon nitride, silicon oxide, silicon carbide, silicon oxycarbide (SiOC), silicon oxycarbon nitride (SiOCN), other materials, or a combination thereof. The spacer layer 118 may include a single layer or a multi-layer structure. In the present embodiment, the spacer layer 118 has a thickness of few nanometers. The spacer layer 118 may be formed by chemical oxidation, thermal oxidation, ALD, CVD, and/or other suitable methods. Referring to FIGS. 6A-6C, the spacer layer 118 is etched by an anisotropic etching process to remove portions of the spacer layer 118 from a top surface of the dummy gate stack 111 and from top and sidewall surfaces of the fins 104. Portions of the spacer layer 118 on the sidewall surfaces of the dummy gate stack 111 substantially remain and become the gate spacer 118. In an embodiment, the anisotropic etching process is a dry (e.g., plasma) etching process.

At operation 18, the method 10 (FIG. 1A) removes the semiconductor layers 108, or portions thereof, from the S/D regions 104a to form spaces 120. Referring to FIGS. 7A-7C, the portions of the semiconductor layers 108 that are covered by the dummy gate stack 111 or buried in the isolation structure 106 are slightly etched or not etched. Further, the semiconductor layers 110 are slightly etched or not etched by the operation 18. As a result, portions of the semiconductor layers 110 in the S/D regions 104a become suspended in the spaces 120 (see FIGS. 7A and 7C). In the following discussion, the portions of the semiconductor layers 110 suspended in the spaces 120 are also referred to the S/D semiconductor layers 110.

In an embodiment, the semiconductor layers 108 are etched by a selective wet etching process that is tuned to remove the semiconductor layers 108 while the semiconductor layers 110 remain substantially unchanged. In some embodiments, the selective wet etching process may include a hydro fluoride (HF) or $NH_4OH$ etchant. In an embodiment where the semiconductor layers 108 comprise SiGe and the semiconductor layers 110 comprise Si, the selective removal of the SiGe layers 108 may include a SiGe oxidation process followed by a SiGeOx removal. For example, the SiGe oxidation process may include forming and patterning various masking layers such that the oxidation is controlled to the SiGe layers 108. In other embodiments, the SiGe oxidation process is a selective oxidation due to the different compositions of the semiconductor layers 108 and 110. In some examples, the SiGe oxidation process may be performed by exposing the device 100 to a wet oxidation process, a dry oxidation process, or a combination thereof. Thereafter, the oxidized semiconductor layers 108, which include SiGeOx, are removed by an etchant such as $NH_4OH$ or diluted HF.

In various embodiments, the semiconductor layers 108 and 110 provide for different oxidation rates and/or different etch selectivity, which enables the selective removal of the semiconductor layers 108 by the operation 18. In an embodiment, the semiconductor layers 110 are slightly etched by the operation 108 to obtain a desirable dimension and shape in the S/D regions 104a. For example, the resultant S/D semiconductor layers 110 may have a bar-like shape (as shown in FIGS. 7A and 7C), a rod-like shape (not shown), or other shapes.

Figure 8D:
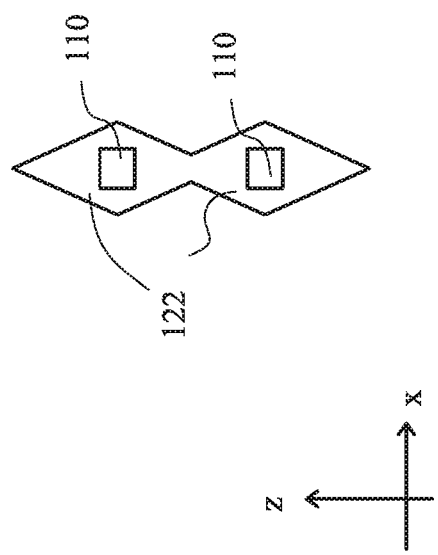
FIGS. 8D, 8E, 8F, and 8G illustrate some source and drain features of semiconductor devices, according to various aspects of the present disclosure.
Figure 8E:
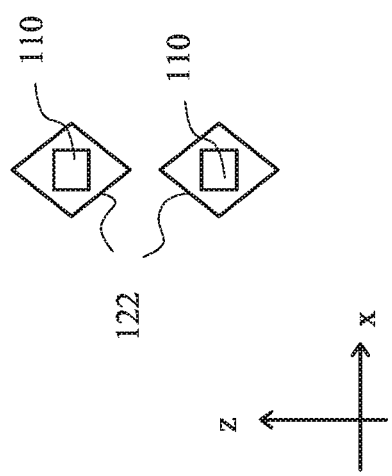

At operation 20, the method 10 (FIG. 1A) epitaxially grows a semiconductor layer 122 in the S/D regions 104a. Referring to FIGS. 8A-8C, the semiconductor layer 122 wraps around each of the S/D semiconductor layers 110 and directly contact the S/D semiconductor layers 110 on all four sides thereof. In the embodiment shown in FIG. 8A, the semiconductor layers 122 and 110 collectively form a vertical (along the "z" direction) bar-like shape. In another embodiment as shown in FIG. 8D, the semiconductor layer 122 may include a plurality of portions and each portion wraps around a respective S/D semiconductor layer 110. Further, each portion of the semiconductor layer 122 may have a diamond shape or another shape. In another embodiment as shown in FIG. 8E, the plurality of portions of the semiconductor layer 122 may merge into one large piece. In some embodiments, the width of the semiconductor layer 122 (along the "x" direction) ranges from a few nanometers to about 30 nm.

In an embodiment, the semiconductor layer 122 includes the same material as the S/D semiconductor layers 110. For example, they both include silicon. In an alternative embodiment, the semiconductor layers 122 and 110 may include different materials or compositions. In various embodiments, the semiconductor layer 122 may include a semiconductor material such as silicon or germanium; a compound semiconductor such as silicon germanium, silicon carbide, gallium arsenide, gallium phosphide, indium phosphide, indium arsenide, indium antimonide; an alloy semiconductor such GaAsP, AlInAs, AlGaAs, InGaAs, GaInP, and/or GaInAsP; or combinations thereof.

In an embodiment, the semiconductor layer 122 is grown by a molecular beam epitaxy (MBE) process, a chemical vapor deposition process, and/or other suitable epitaxial growth processes. In a further embodiment, the semiconductor layer 122 is in-situ or ex-situ doped with an n-type dopant or a p-type dopant. For example, in some embodiments, the semiconductor layer 122 includes silicon-germanium (SiGe) doped with boron for forming S/D features for a PFET. In some embodiments, the semiconductor layer 122 includes silicon doped with phosphorous for forming S/D features for a NFET. To further these embodiments, the SiGe layer 122 may include Ge ranging from about 10% to about 70% in molar ratio. In an embodiment, the semiconductor layer 122 is highly doped in order to form an ohmic contact with an S/D contact metal to be later formed in the device 100.

In the present embodiment, the semiconductor layers 122 and 110 collectively serve as S/D features for the device 100. In an embodiment, the semiconductor layers 122 and 110 include the same type of dopant (e.g., both are n-type doped or both are p-type doped), but the dopant concentration is higher in the semiconductor layer 122 than in the S/D semiconductor layers 110. In a further embodiment, the semiconductor layers 122 and 110 may include the same type of dopants but may have different dopant species.

Figure 8G:
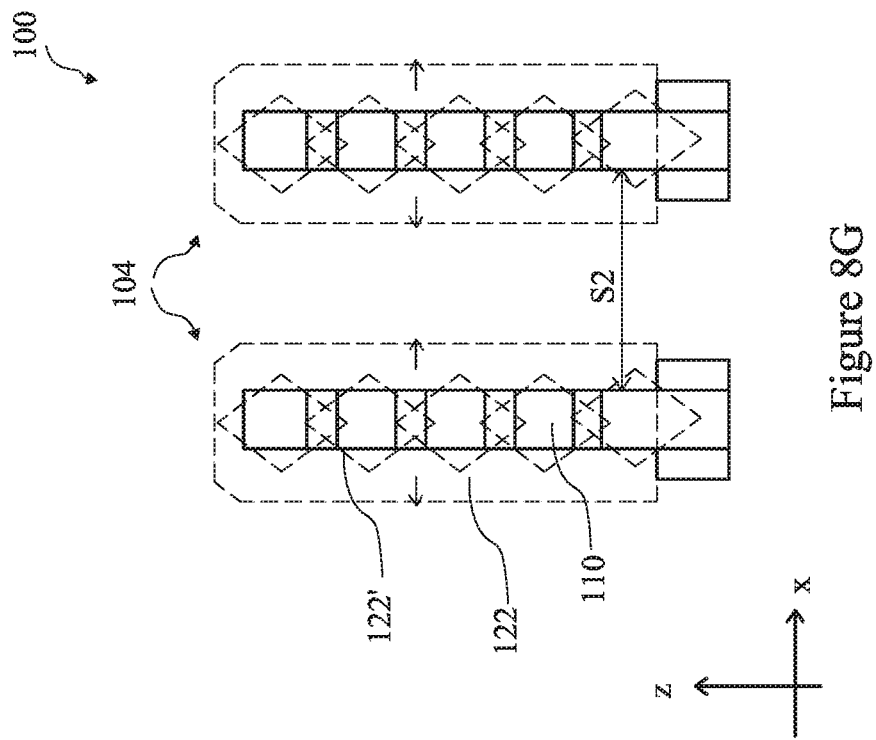
Figure 8F:
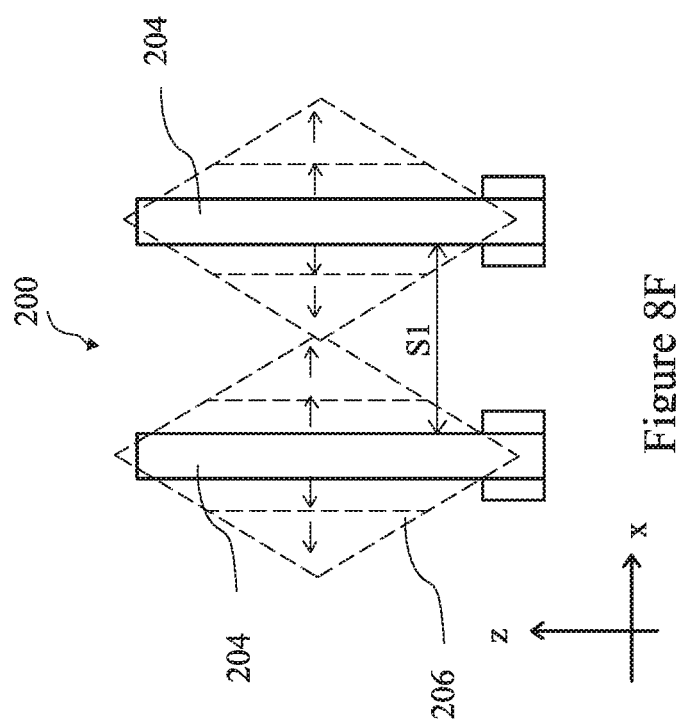

Embodiments of the present disclosure provide advantages over other methods in forming S/D features of a HGAA device. In a method as shown in FIG. 8F, fins 204 (comparable to the fins 104) are fully etched in their respective S/D regions and semiconductor layers 206 are subsequently grown in the respective S/D regions as the S/D features for a HGAA device 200. The semiconductor layers 206 each have a diamond shape due to the different growth rates at the different crystalline orientations, which is an inherent property of the material in the semiconductor layer 206. Consequently, the minimum spacing S1 between the two fins 204 is limited in order to make the S/D features 206 sufficiently large while preventing adjacent S/D features 206 from merging together. In contrast, embodiments of the present disclosure grows the semiconductor layer 122 (an S/D feature) using the S/D semiconductor layers 110 as a base, which limits the lateral growth of the semiconductor layer 122. This is illustrated in FIG. 8G with an embodiment where the fin 104 includes five S/D semiconductor layers 110. Referring to FIG. 8G, in an intermediate epitaxial growth stage, each semiconductor layer 122' grows off a respective S/D semiconductor layer 110. The lateral growth of the semiconductor layers 122' is limited by the size and shape of the respective S/D semiconductor layers 110. As the semiconductor layers 122' grow, they merge into a larger semiconductor layer 122, which has a vertical bar-like shape. As a result of the limited lateral growth of the semiconductor layers 122', the minimum spacing S2 between two adjacent fins 104 can be made smaller than S1, which advantageously increases the integration of the semiconductor device.

Figures 9A, 9B, 9C:
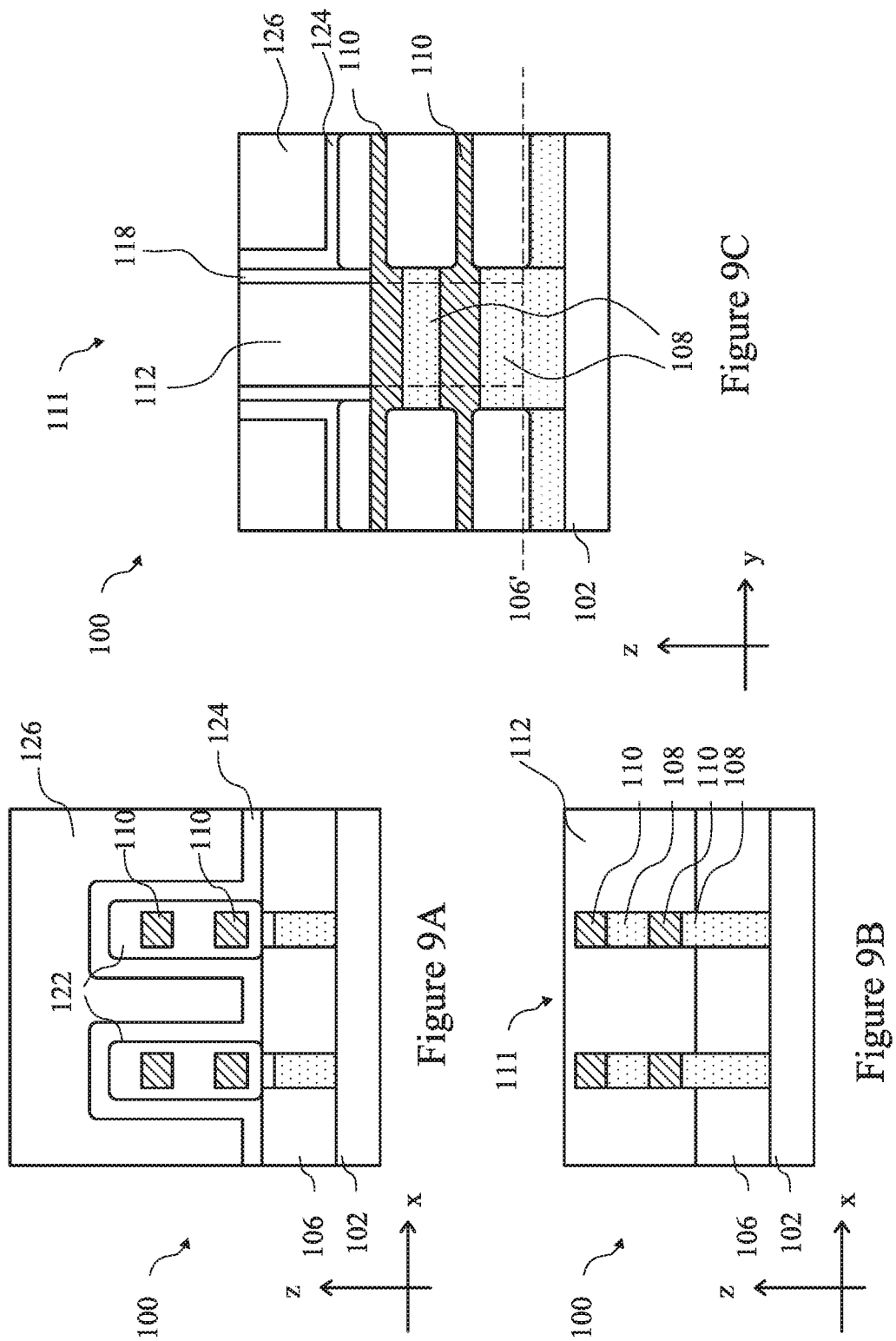

At operation 22, the method 10 (FIG. 1B) forms an inter-layer dielectric (ILD) layer 126 over the semiconductor layer 122 and the isolation structure 106. Referring to FIGS. 9A-9C, in the present embodiment, a contact etch stop (CES) layer 124 is formed over the semiconductor layer 122 and the isolation structure 106 prior to the formation of the ILD layer 126. The CES layer 124 may include a dielectric material such as silicon nitride, silicon oxide, silicon oxynitride, and/or other materials. The CES layer 124 may be formed by ALD, PECVD, or other suitable deposition or oxidation processes. The ILD layer 126 may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The ILD layer 126 may be deposited by a PECVD process, a flowable CVD (FCVD) process, or other suitable deposition technique. In an embodiment, after the CES layer 124 and the ILD layer 126 are deposited, a CMP process is performed to planarize a top surface of the device 100, which also removes the hard mask layer 116 and the etch stop layer 114 (FIGS. 8B and 8C). As a result, the poly layer 112 is exposed from a top surface of the device 100.

Figures 10A, 10B, 10C:
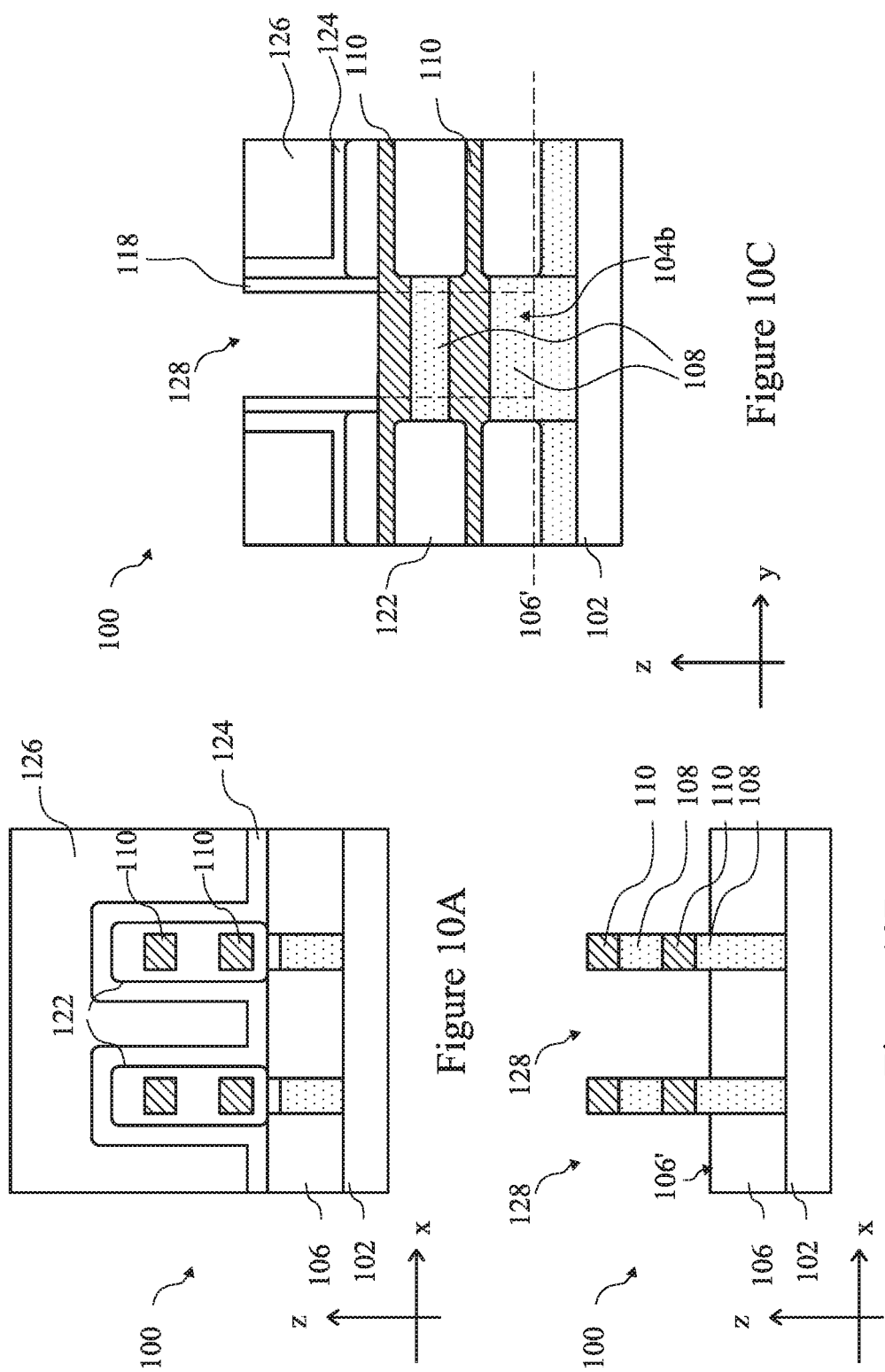

At operation 24, the method 10 (FIG. 1B) removes the dummy gate stack 111 to expose the channel region 104b of the fins 104. Referring to FIGS. 10A-10C, the dummy gate stack 111 (see FIGS. 9B and 9C), which includes the poly layer 112 and any other layers thereunder, is removed to form an opening 128. The channel region 104b of the fins 104 are exposed in the opening 128. In an embodiment, the operation 24 includes one or more etching processes, such as wet etching, dry etching, or other etching techniques.

Figures 11A, 11B, 11C:
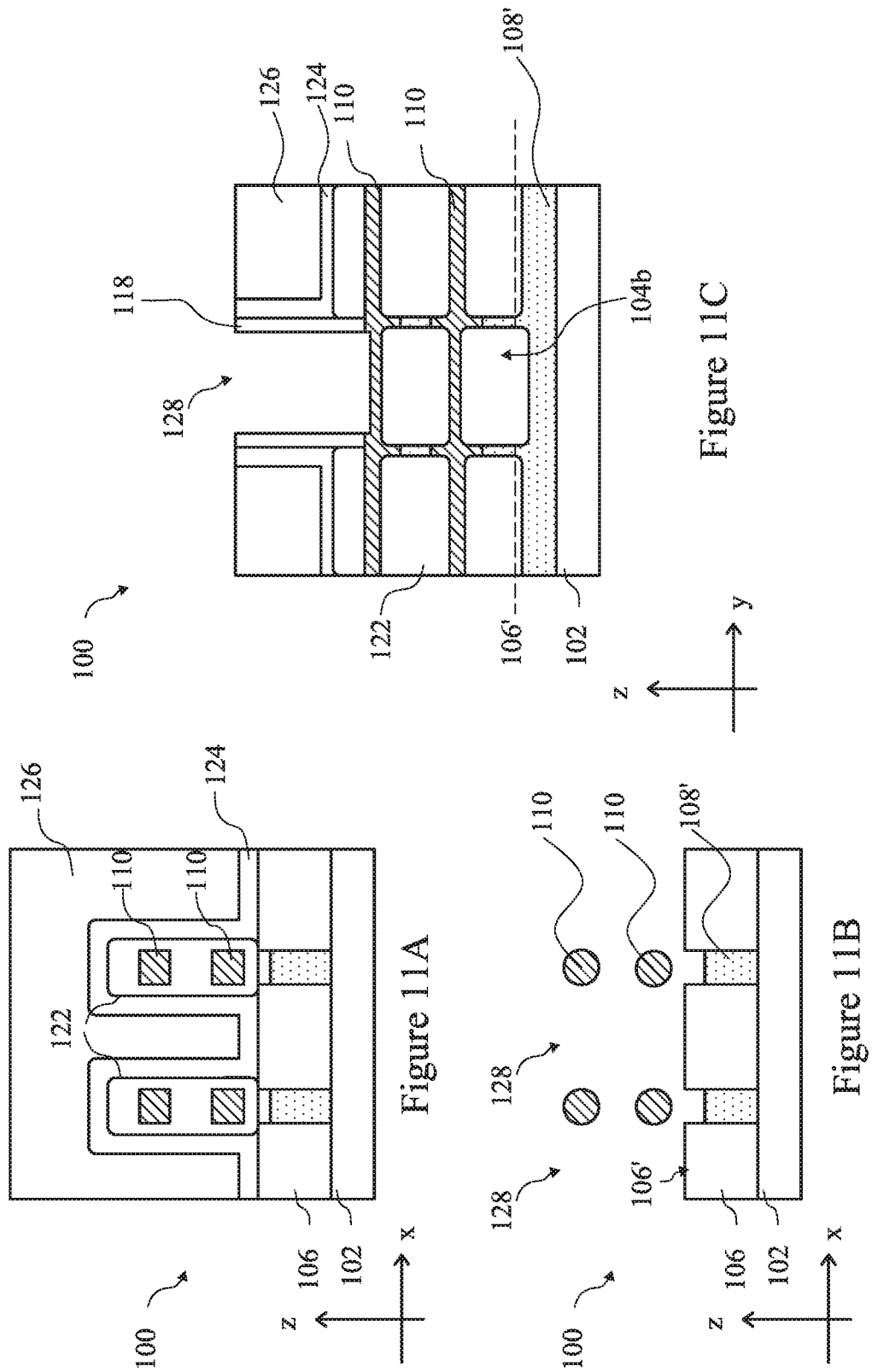

At operation 26, the method 10 (FIG. 1B) removes portions of the semiconductor layers 108 through the opening 128. Referring to FIGS. 11A-11C, the semiconductor layers 108, or portions thereof, in the channel region 104b are removed. As a result, portions of the semiconductor layers 110 in the channel region 104b are suspended in the opening 128. In the following discussion, the portions of the semiconductor layers 110 suspended in the opening 128 are also referred to as the channel semiconductor layers 110. The channel semiconductor layers 110 are slightly etched or not etched by the operation 26. In the present embodiment, the channel semiconductor layers 110 are slightly etched to form a rod-like shape (e.g., a nanowire) (see FIG. 11B). In various embodiment, the channel semiconductor layers 110 (FIG. 11B) and the S/D semiconductor layers 110 (FIG. 11A) may have same or different cross-sectional profiles. For example, either or both of them may have a rectangular shape, a round shape, or another geometrical shape in the "x-z" plane.

In an embodiment, the selective removal of the semiconductor layers 108 by the operation 26 may use the same technique(s) discussed above with reference to the operation 18. In an embodiment, the remaining portions of the semiconductor layer 108 are oxidized to become an oxidation layer 108' for isolation purposes. To further this embodiment, the oxidation process may include a wet oxidation process, a dry oxidation process, or a combination thereof. In one example, the device 100 is exposed to a wet oxidation process using water vapor or steam as the oxidant. In one example where the semiconductor layer 108 includes silicon-germanium, the oxidation layer 108' includes silicon or silicon-germanium oxide.

At operation 28, the method 10 (FIG. 1B) forms a gate stack 129 over the channel region 104b of the fins 104. Referring to FIGS. 12A-12C, the gate stack 129 fills the opening 128 (FIGS. 11B and 11C) and wraps around each of the channel semiconductor layers 110 (e.g., nanowires). In the present embodiment, the gate stack 129 includes a dielectric layer 130 which may consist of one or multiple layers of dielectric materials on interior surfaces of the opening 128 and directly wrapping over each of the channel semiconductor layers 110. The gate stack 129 further includes a gate metal stack 132 which may consist of one or multiple layers over the dielectric layer 130, and a metal fill layer 134 over the gate metal stack 132. As shown in FIG. 12B, the layers 130 and 132 wrap around each of the channel semiconductor layers 110 (e.g., nanowires) to form transistor channels thereof. The thicknesses of the layers 130 and 132 are controlled so that the layers 132 from adjacent transistor channels do not contact each other. Referring to FIGS. 12B and 12C, the gate stack 129 wraps around the vertically-stacked horizontally-oriented channel semiconductor layers 110. Hence, the device 100 is a stacked horizontal gate-all-around (S-HGAA) device. Referring to FIG. 12A, the S/D region of the device 100 includes multiple S/D semiconductor layers 110 spaced from each other, and further includes the semiconductor layer 122 that wraps around each of the multiple semiconductor layers 110.

In an embodiment, the dielectric layer 130 may include a dielectric material such as silicon oxide or silicon oxynitride, and may be formed by chemical oxidation, thermal oxidation, ALD, CVD, and/or other suitable methods. The dielectric layer 130 may also include a high-k dielectric layer such as hafnium oxide, zirconium oxide, lanthanum oxide, titanium oxide, yttrium oxide, strontium titanate, other suitable metal-oxides, or combinations thereof; and may be formed by ALD and/or other suitable methods. In an embodiment, the gate metal stack 132 may include a work function metal layer. The work function metal layer may be a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. The p-type or n-type work function metal layer may include a plurality of layers and may be deposited by CVD, PVD, and/or other suitable process. The metal fill layer 134 may include aluminum, tungsten, cobalt, copper, and/or other suitable materials, and may be formed by CVD, PVD, plating, and/or other suitable processes. In an embodiment, after the various layers 130, 132, and 134 are deposited, a CMP process is performed to planarize a top surface of the device 100.

At operation 30, the method 10 (FIG. 1B) performs further processing to complete the fabrication of the S-HGAA device 100. For example, it may form contact openings, contact metal, as well as various contacts, vias, wires, and multilayer interconnect features (e.g., metal layers and interlayer dielectrics) over the substrate 102, configured to connect the various features to form a functional circuit that may include one or more multi-gate devices. In particular, it may form a contact metal penetrating through the ILD layer 126 and contacting the semiconductor layer 122.

Although not intended to be limiting, one or more embodiments of the present disclosure provide many benefits to a semiconductor device and a formation process thereof. For example, embodiments of the present disclosure form source and drain (S/D) features for stacked horizontal gate-all-around (S-HGAA) devices. The S/D features may be formed to have a narrow profile to fit into a tight fin-to-fin spacing. This advantageously increases the level of integration for the S-HGAA devices. Further, embodiments of the present disclosure may be used to form S-HGAA devices with any number of stacked channels, providing for great flexibility and scalability. Still further, embodiments of the present disclosure may be integrated into existing CMOS fabrication flow, providing for improved process window.

In one exemplary aspect, the present disclosure is directed to a method of forming a semiconductor device. The method includes forming a fin extending from a substrate. The fin has a source/drain (S/D) region and a channel region. The fin includes a first semiconductor layer and a second semiconductor layer on the first semiconductor layer. The first semiconductor layer has a first composition, and the second semiconductor layer has a second composition different from the first composition. The method further includes removing the first semiconductor layer from the S/D region of the fin such that a first portion of the second semiconductor layer in the S/D region is suspended in a space. The method further includes epitaxially growing a third semiconductor layer in the S/D region, the third semiconductor layer wrapping around the first portion of the second semiconductor layer.

In another exemplary aspect, the present disclosure is directed to a method of forming a semiconductor device. The method includes forming a fin extending from a substrate. The fin includes a plurality of first semiconductor layers and a plurality of second semiconductor layers, wherein the first and second semiconductor layers are alternately stacked. The method further includes forming a dummy gate stack over a channel region of the fin, and removing portions of the first semiconductor layers from S/D regions of the fin such that first portions of the second semiconductor layers in the S/D regions each are suspended in a respective space. The method further includes epitaxially growing a third semiconductor layer in the S/D regions, wherein the third semiconductor layer wraps around each of the first portions of the second semiconductor layers. The method further includes removing the dummy gate stack, thereby exposing the channel region of the fin. The method further includes removing portions of the first semiconductor layers from the channel region of the fin such that second portions of the second semiconductor layers in the channel region each are suspended in a respective space. The method further includes forming a gate stack over the channel region of the fin, wherein the gate stack wraps around each of the second portions of the second semiconductor layers.

In yet another exemplary aspect, the present disclosure is directed to a semiconductor device. The semiconductor device includes a substrate, and a fin element extending from the substrate. The fin element includes a channel region and two source and drain (S/D) regions on opposing sides of the channel region. The channel region includes channel semiconductor layers spaced from each other. The S/D regions each include first semiconductor layers spaced from each other and a second semiconductor layer wrapping around each of the first semiconductor layers. The semiconductor device further includes a gate stack disposed over the channel region of the fin element and surrounding each of the channel semiconductor layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
   a first nanowire and a second nanowire that include a first semiconductor material;
   a gate that wraps a channel region of the first nanowire and the second nanowire;
   a source/drain feature that wraps source/drain regions of the first nanowire and the second nanowire, wherein the source/drain feature includes a second semiconductor material;
   a fin-like semiconductor layer disposed over a substrate, wherein the first nanowire and the second nanowire are disposed over the fin-like semiconductor layer, such that the first nanowire, the second nanowire, and the fin-like semiconductor layer extend substantially parallel to one another along the same length-wise direction and further wherein the fin-like semiconductor layer includes a third semiconductor material; and
   wherein the first semiconductor material includes silicon, the second semiconductor material includes silicon and germanium, and the third semiconductor material includes silicon and germanium.

2. The transistor of claim 1, wherein the fin-like semiconductor layer is a first fin-like semiconductor layer, the transistor further comprising:
   a second fin-like semiconductor layer disposed over the substrate and directly adjacent to the first fin-like semiconductor layer, wherein the second fin-like semiconductor layer includes the third semiconductor material;
   a third nanowire and a fourth nanowire disposed over the second fin-like semiconductor layer, such that the third nanowire, the fourth nanowire, and the second fin-like semiconductor layer extend substantially parallel to one another along the same length-wise direction, and further wherein the third nanowire and the fourth nanowire include the first semiconductor material; and
   wherein the gate wraps a channel region of the third nanowire and the fourth nanowire.

3. The transistor of claim 2, wherein a spacing between the first fin-like semiconductor layer and the second fin-like semiconductor layer is less than about 50 nm.

4. The transistor of claim 1, wherein a concentration of the germanium in the third semiconductor material is about 25% to about 50%.

5. The transistor of claim 1, wherein a concentration of the germanium in the second semiconductor material is about 10% to about 70%.

6. The transistor of claim 1, wherein the gate completely fills a space between the channel regions of the first nanowire and the second nanowire and a space between the channel region of the first nanowire and the fin-like semiconductor layer.

7. The transistor of claim 1, wherein the source/drain feature completely fills a space between the source/drain regions of the first nanowire and the second nanowire and a space between the source/drain region of the first nanowire and the fin-like semiconductor layer.

8. The transistor of claim 1, further comprising an isolation feature that surrounds the fin-like semiconductor layer, wherein the fin-like semiconductor layer extends vertically from the isolation feature.

9. The transistor of claim 1, wherein a width of the source/drain feature is less than about 30 nm.

10. The transistor of claim 1, wherein the channel regions of the first nanowire and the second nanowire have a circular cross-section and the source/drain regions of the first nanowire and the second nanowire have a rectangular cross-section.

11. A transistor, comprising:
   a first silicon nanowire and a second silicon nanowire disposed over a substrate, wherein the first silicon nanowire is disposed over the second silicon nanowire;
   a high-k/metal gate stack that surrounds a first channel region of the first silicon nanowire and a second channel region of the second silicon nanowire, wherein the high-k/metal gate stack fills a first space between the first channel region of the first silicon nanowire and the second channel region of the second silicon nanowire and a second space between the second channel region of the second silicon nanowire and the substrate; and
   silicon germanium source/drain features that encircle first source/drain regions of the first silicon nanowire and second source/drain regions of the second silicon nanowire, wherein the silicon germanium source/drain features fill a third space between the first source/drain regions of the first silicon nanowire and the second source/drain regions of the second silicon nanowire and a fourth space between the second source/drain regions of the second silicon nanowire and the substrate.

12. The transistor of claim 11, wherein a dopant concentration of a dopant in the silicon germanium source/drain features is greater than a dopant concentration of a dopant in each of the first silicon nanowire and the second silicon nanowire.

13. The transistor of claim 11, wherein each of the first silicon nanowire and the second silicon nanowire is substantially dopant-free, and the silicon germanium source/drain features include boron.

14. The transistor of claim 11, further comprising a silicon germanium oxide layer disposed between the silicon germanium source/drain features and the substrate.

15. The transistor of claim 11, wherein a thickness of each of the first silicon nanowire and the second silicon nanowire is about 5 nm to about 20 nm.

16. A transistor, comprising:
   a first silicon nanowire and a second silicon nanowire disposed over a substrate, wherein the first silicon nanowire is disposed over the second silicon nanowire;
   a high-k/metal gate stack that surrounds a first channel region of the first silicon nanowire and a second channel region of the second silicon nanowire, wherein the high-k/metal gate stack fills a first space between the first channel region of the first silicon nanowire and the second channel region of the second silicon nanowire and a second space between the second channel region of the second silicon nanowire and the substrate; and
   silicon source/drain features that encircle first source/drain regions of the silicon nanowire and second source/drain regions of the second silicon nanowire, wherein the silicon source/drain features fill a third space between the first source/drain regions of the first silicon nanowire and the second source/drain regions of the second silicon nanowire and a fourth space between the second source/drain regions of the second silicon nanowire and the substrate.

17. The transistor of claim 16, wherein a dopant concentration of a dopant in the silicon source/drain features is greater than a dopant concentration of a dopant in each of the first silicon nanowire and the second silicon nanowire.

18. The transistor of claim 16 wherein each of the first silicon nanowire and the second silicon nanowire is substantially dopant-free, and the silicon source/drain features include phosphorous.

19. The transistor of claim 16, further comprising a silicon germanium oxide layer disposed between the silicon source/drain features and the substrate.

20. The transistor of claim 16, wherein a thickness of each of the first silicon nanowire and the second silicon nanowire is about 5 nm to about 20 nm.

* * * * *